(12) United States Patent
Murden, II et al.

(10) Patent No.: US 7,889,004 B1
(45) Date of Patent: Feb. 15, 2011

(54) OPERATIONAL AMPLIFIERS WITH ENHANCED PARAMETERS

(75) Inventors: Franklin Marshall Murden, II, Roan Mountain, TN (US); Scott Gregory Bardsley, Gibsonville, NC (US); Michael Elliott, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/571,038

(22) Filed: Sep. 30, 2009

(51) Int. Cl.
*H03F 3/45* (2006.01)
(52) U.S. Cl. .................. 330/253; 330/310
(58) Field of Classification Search ........... 330/253, 330/310, 150, 98, 261
See application file for complete search history.

(56) References Cited

U.S. PATENT DOCUMENTS

| | | | | |
|---|---|---|---|---|
| 4,559,502 A | 12/1985 | Huijsing | ............... | 330/294 |
| 5,155,447 A | 10/1992 | Huijsing et al. | ............... | 330/107 |
| 5,325,069 A | 6/1994 | Sundby | ............... | 330/253 |
| 5,363,059 A | 11/1994 | Thiel | ............... | 330/253 |
| 5,742,154 A | 4/1998 | Kolluri | ............... | 323/313 |
| 6,515,560 B1 | 2/2003 | Adan | ............... | 333/214 |
| 6,556,083 B2 | 4/2003 | Kadanka | ............... | 330/293 |
| 6,617,931 B2 | 9/2003 | Theus et al. | ............... | 330/310 |
| 6,642,674 B2 | 11/2003 | Liao et al. | ............... | 315/291 |
| 6,873,209 B2* | 3/2005 | Takata et al. | ............... | 330/253 |
| 7,564,306 B2 | 7/2009 | Lee et al. | ............... | 330/258 |
| 7,692,489 B2* | 4/2010 | Kelly et al. | ............... | 330/258 |
| 2002/0113659 A1* | 8/2002 | Scoggins | ............... | 331/117 R |

\* cited by examiner

*Primary Examiner*—Henry K Choe
(74) *Attorney, Agent, or Firm*—Koppel, Patrick, Heybl & Dawson (57) ABSTRACT

Operational amplifier embodiments are provided to enhance amplifier parameters such as bandwidth, stability, and headroom. In an amplifier embodiment, transistor followers are arranged with first and second differential pairs to facilitate selective positioning of first and second transfer function poles to enhance bandwidth and resistors and inductors are arranged to facilitate selective positioning of complex third transfer function poles to enhance phase margin. In another amplifier embodiment, the transistor followers are arranged to reduce headroom limitations to thereby enhance the voltage swing of output signals.

14 Claims, 5 Drawing Sheets

OPERATIONAL AMPLIFIERS WITH ENHANCED PARAMETERS

BACKGROUND OF THE INVENTION

1. Field of the Invention

The present invention relates generally to operational amplifiers and, more particularly, to analog-to-digital converter systems that include such amplifiers.

2. Description of the Related Art

Operational amplifiers generally position one or more stages of differential pairs of transistors in arrangements which seek to realize a high open-loop gain. In typical uses of these amplifiers, feedback structures are looped about them to lower and broaden a resulting closed-loop response. Various compensation structures have been proposed for operational amplifiers to enhance the stability of this closed-loop response. It has often been found, however, that various amplifier parameters (e.g., bandwidth, phase margin and headroom) do not meet desired performance levels. This has been especially the case when the operational amplifiers drive capacitive loads.

BRIEF SUMMARY OF THE INVENTION

The present disclosure is directed to operational amplifiers with enhanced amplifier parameters. The novel features of the disclosure are set forth with particularity in the appended claims. The disclosure will be best understood from the following description when read in conjunction with the accompanying drawings.

DETAILED DESCRIPTION OF THE INVENTION

Figure 1:
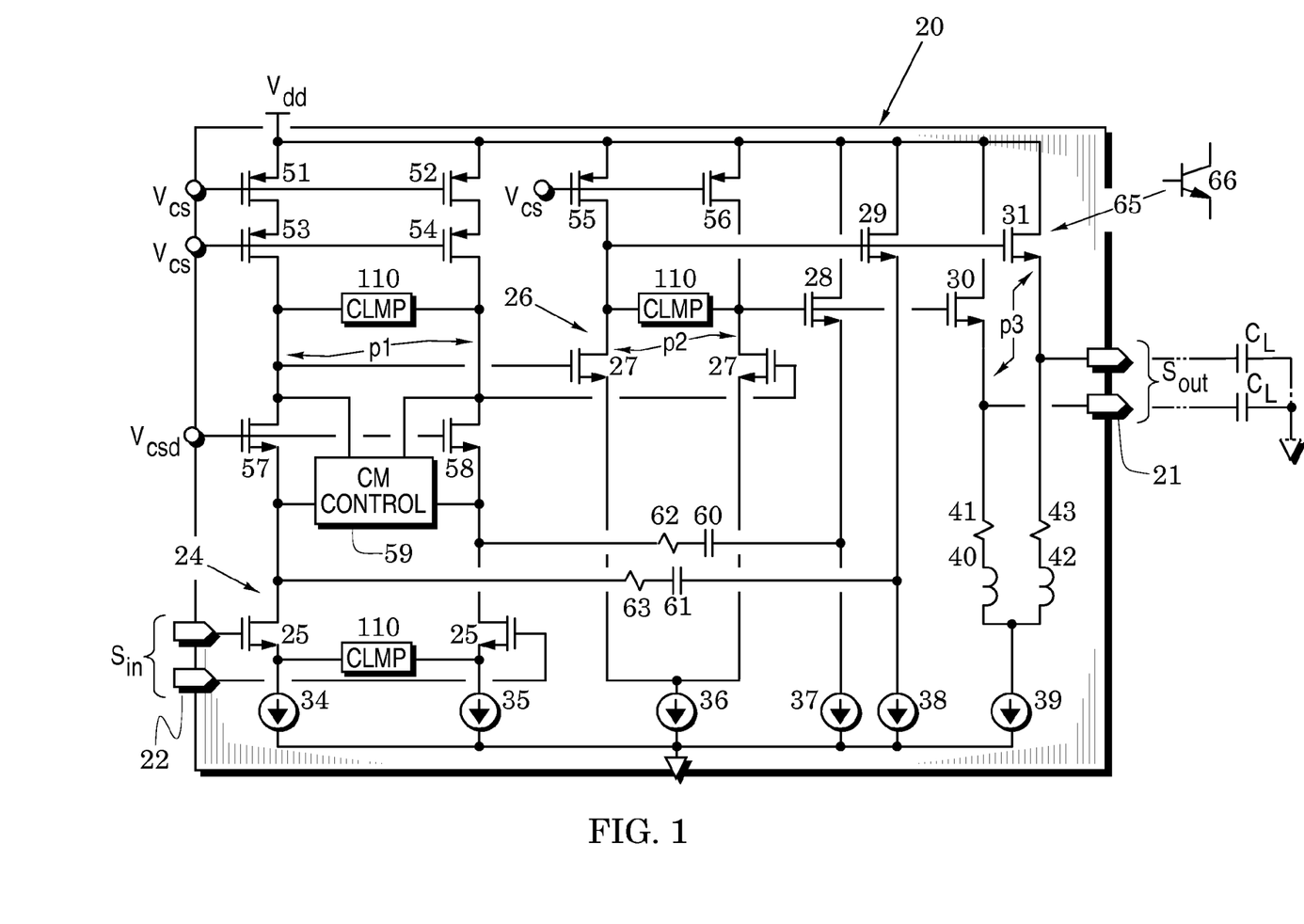
FIG. 1 is a schematic of an amplifier embodiment of the present disclosure.
Figure 3:
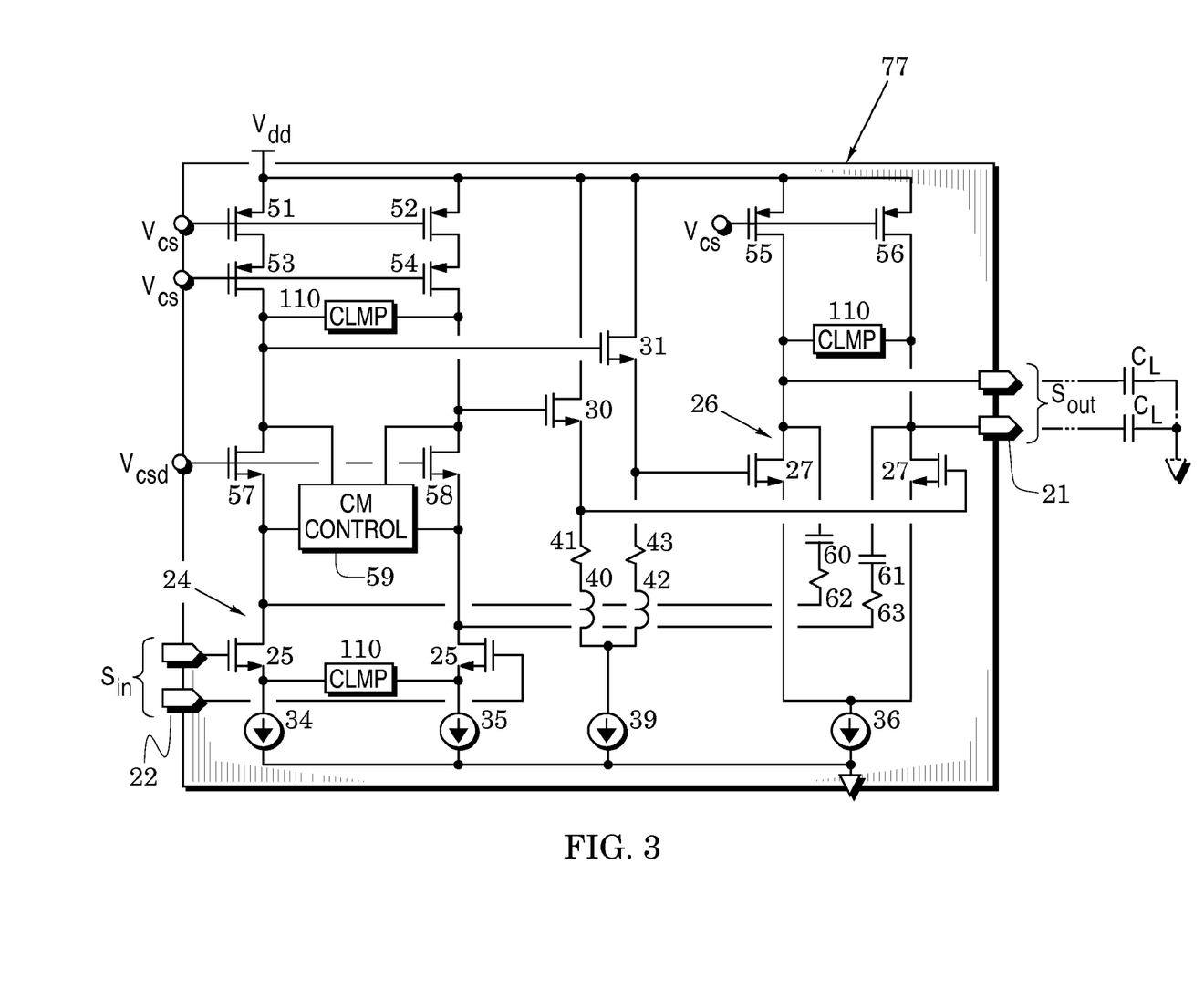
FIG. 3 is a schematic of another amplifier embodiment.

FIGS. 1 and 3 illustrate amplifier embodiments which enhance amplifier parameters such as bandwidth, stability, and headroom. These enhancements are of significant value when the embodiments are used as amplifying elements in various feedback arrangements, e.g., as the amplifying element in switched-capacitor feedback structures shown in association with FIGS. 5, 6A and 6B.

In an amplifier embodiment, transistor followers are arranged with first and second differential pairs to facilitate selective positioning of first and second transfer function poles to enhance bandwidth and resistors and inductors are arranged to facilitate selective positioning of complex third transfer function poles to enhance phase margin. In another amplifier embodiment, the transistor followers are arranged to reduce headroom limitations to thereby enhance the voltage swing of output signals.

In particular, FIG. 1 illustrates an operational amplifier 20 configured for driving a load at an output port 21 in response to a differential input signal $S_{in}$ at an input port 22. In an exemplary application, the amplifier 20 may generate a differential output signal $S_{out}$ across a load in the form of capacitive loads $C_L$ that are indicated at the output port.

The amplifier 20 includes a first differential pair 24 of input transistors 25, a second differential pair 26 of transistors 27, first transistor followers 28 and 29, and second transistor followers 30 and 31. Current sources 34, 35 and 36 provide tail currents to the first and second differential pairs 24 and 26 and current sources 37 and 38 provide currents to the first transistor followers 28 and 29. A current source 39 also provides a current of which a portion is directed through an inductive element 40 and a resistive element 41 from the second transistor follower 30 and another portion is directed through an inductive element 42 and a resistive element 43 from the second transistor follower 31.

Differential loads for the first differential pair 24 are preferably formed with current sources 51 and 52 to thus provide high impedance which enhances the voltage swing at the output of this amplifier stage. Preferably, current sources 53 and 54 are inserted in series with the current sources 51 and 52 to further enhance the voltage swing in the first differential pair. Similarly, differential loads for the second differential pair 26 are preferably formed with current sources 55 and 56.

The control terminals (e.g., gates) of the current sources are biased with current-source voltages $V_{cs}$ that may be provided, for example, by structuring the current sources 51-56 as portions of current minors (to enhance drawing clarity, other minor portions are not shown). Preferably, cascode transistors 57 and 58 are inserted between the input transistors 25 and their current-source loads to enhance the output impedance of the first differential pair 24.

A common-mode controller 59 is coupled to sense signal levels at the output terminals of the cascode transistors 57 and 58 and, in response, apply control signals at their input terminals that fix and maintain a common-mode level of signals that are generated in response to the differential input signal $S_{in}$ at the input port 22.

Compensation capacitors 60 and 61 are each coupled to a respective one of the input transistors 25 and are each driven by a respective one of the first transistor followers 28 and 29. Preferably, resistive elements 62 and 63 are respectively inserted in series with the compensation capacitors 60 and 61.

Although the amplifier 20 of FIG. 1 is shown to be formed with metal-oxide-semiconductor transistors, other amplifier embodiments may be realized with different transistor types or combination of types. For example, bipolar junction transistors may be substituted for the metal-oxide-semiconductor transistors as indicated by the substitution arrow 65 which substitutes bipolar junction transistor 66 for the metal-oxide-semiconductor transistor 31. Accordingly, the generic term transistor followers has been used in the above description to indicate that the transistors 28-31 may be source followers as shown in FIG. 1 or may be, for example, emitter followers.

In operation of the amplifier 20, the first differential pair 24 drives the second differential pair 26 in response to the input signal $S_{in}$ and the second differential pair provides further-amplified signals in response to the first differential pair. In an important feature, the first transistor followers 28 and 29 and the second transistor followers 30 and 31 all respond to the second differential pair 26 but the first transistor followers drive the compensation capacitors 60 and 61 and the second transistor followers drive the capacitive loads $C_L$.

These features provide a bandwidth enhancement which may be investigated by initially observing that the open-loop transfer function of the amplifier 20 will include a first pole generated by parasitic capacitances associated with the output paths of the first differential pair 24. This first pole will be a dominant pole p1 but a nondominant pole p2 is also generated by parasitic capacitances associated with the output paths of the second differential pair 26.

In various applications of the amplifier 20, feedback circuits are preferably added to achieve a closed-loop gain which is substantially lower and substantially broader than the amplifier's open-loop gain. However, if the dominant first pole p1 is unaltered it will be difficult to lower the closed-loop gain without introducing excessive phase (e.g., approaching 180 degrees) into the feedback signal and this excessive phase will lead to an unstable condition.

Closed-loop stability is enhanced by lowering the frequency of the dominant first pole p1 and, accordingly, the compensation capacitors 60 and 61 are coupled from the second differential pair 26 (via the first transistor followers 28 and 29) back to the first differential pair 24 to achieve this goal. These compensation capacitors substantially move the dominant pole p1 of the open-loop transfer function down to the position shown in the plot 71 in the Bode graph 70 of FIG. 2. Because of their positions relative to the signal gain of the second differential pair 26 in the amplifier 20, the value of these capacitors is multiplied by the Miller effect that is achieved when a capacitor is fed back across a signal gain. Accordingly, the actual value of these compensation capacitors is significantly lowered which reduces their physical size and facilitates their use in submicron integrated circuits.

Unfortunately, the capacitance of these compensation capacitors plus the capacitance of the capacitive load $C_L$ would also significantly lower the position of the second pole p2 so that it would be difficult to obtain a high closed-loop gain. In another important feature, the first transistor followers 28 and 29 are inserted to unload the capacitance of the compensation capacitors 60 and 61 from the output of the second differential pair 26. This provides an additional degree of freedom because the location of the first pole p1 can now be moved independently of movements of the second pole p2.

The resistive elements 62 and 63 can be selected to move the location of an associated transfer function zero (not shown in FIG. 2) to further enhance amplifier stability. These resistive elements can be realized with various resistive structures (e.g., resistors or transistors that are biased in their triode regions).

With the position of the first pole p1 established, another important feature inserts the second transistor followers 30 and 31 to unload the capacitance of the capacitive loads $C_L$ from the output of the second differential pair 26. Before this latter insertion, the frequency of the second pole is approximately given by $$p2 \approx \frac{g_{m_{27}}}{2\pi(C_p + C_L)} \quad (1)$$

in which $g_{m_{27}}$ is the transconductance of the transistors 27 and $C_p$ is the parasitic capacitance associated with the output terminals of the second differential pair 26. After insertion of the second transistor followers 30 and 31, the capacitive load $C_L$ is offloaded and the frequency of the second pole approximately increases to $$p2' \approx \frac{g_{m_{27}}}{2\pi C_p}. \quad (2)$$

Figure 2:
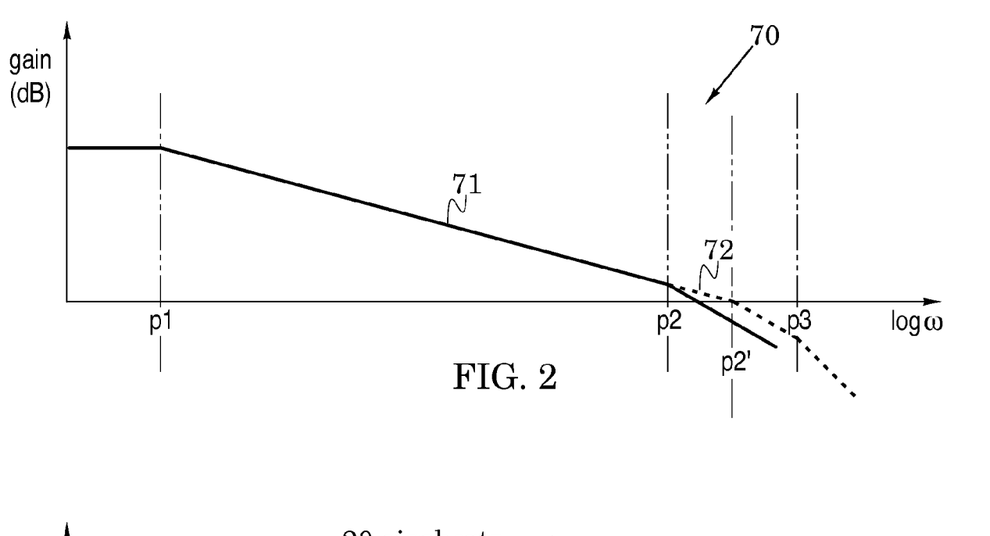
FIG. 2 is a Bode plot that illustrates bandwidth and phase margin advantages of the amplifier of FIG. 1.

FIG. 2 shows the substantial outward movement of the second pole from a first position p2 as given by equation (1) to s second position p2' as given by equation (2). Because the horizontal axis in FIG. 2 is logarithmic, this increase is more significant than it might appear to be in the graph.

Because the capacitive load $C_L$ is now driven by the second transistor followers 30 and 31, a third pole p3 of the amplifier's transfer function is approximately positioned at $$p3 \approx \frac{g_{m_{30,31}}}{2\pi C_L} \quad (3)$$

in which $g_{m_{30,31}}$ is the transconductance of the second transistor followers 30,31. Insertion of the first transistor followers 28 and 29 and the second transistor followers 30 and 31 has, therefore, altered the outer portions of the open-loop transfer function from the plot 71 to the broken-line plot 72. Because of this extension, the closed-loop transfer function can now be significantly lowered and broadened while yet maintaining an adequate phase margin. For example, the gain of the closed-loop transfer function could be constant out to the frequency of the altered second pole position p2'.

In another important feature, the third pole is modified by positioning the inductive elements 40 and 42 to be in parallel with the capacitive loads $C_L$ so that they resonate with the loads and alter the third pole p3 to a pair of complex poles. The resistive elements 41 and 43 of FIG. 1 can then be selected to adjust a desired damping factor associated with these poles. The inductive and resistive elements thus provide yet another degree of freedom for adjusting the phase margin associated with the plot 72 in FIG. 2. The inductive elements 40 and 42 can be realized with various inductive structures (e.g., spiral inductors or active inductor circuits) while the resistive elements 41 and 43 can be realized with various resistive structures (e.g., resistors or transistors that are biased in their triode regions).

The structures of the amplifier 20 thus provide several degrees of freedom. For example, the compensation capacitors 60 and 61 can be selected to establish the location of a transfer function pole (p1 in FIG. 2) without significantly moving the location of other transfer function poles. The location of a second pole p2 is stabilized by introduction of the second transistor followers 30 and 31. Inductive and resistive elements 40-43 can be selected to further enhance phase margin by altering another transfer function pole (p3 in FIG. 2) into complex poles which may be appropriately positioned to obtain such margin.

In FIG. 2, it is noted that loop gain is basically the region between the open-loop transfer function 71 (as modified by the broken-line plot 72) in FIG. 2 and a closed-loop transfer function that is obtained when feedback structures augment the amplifier 20 of FIG. 1. The phase associated with this loop gain must be less than 180 degrees to insure closed-loop stability. In particular, the phase must be less than 180 degrees at the point where the loop gain has dropped to zero. The phase margin is the difference, at this point, between 180 degrees and the phase associated with the loop gain.

FIG. 3 illustrates another operational amplifier embodiment 77 that includes elements of the amplifier 20 of FIG. 1 with like elements indicated by like reference numbers. In this amplifier embodiment, the transistor followers 30 and 31 have been moved to a position between the first and second differential pairs 24 and 26. Therefore, the transistor followers 30 and 31 now respectively respond to the outputs of the cascode transistors 57 and 58 and these transistor followers now respectively drive the control terminals of the transistors 27 of the second differential pair 26. In addition, the transistor followers 28 and 29 of FIG. 1 have been removed so that the compensation capacitors 60 and 61 are driven directly by the transistors 27 of the second differential pair 26.

The amplifier embodiment 77 is especially suited to enhance the headroom of signals that are processed through to the output port 21. This advantage may be investigated by initially returning attention to the amplifier embodiment 20 of FIG. 1 and noting what happens if the resistance of the resistors 41 and 43 is set substantially equal to the output impedance $1/g_m$ of the transistors 30 and 31.

This setting will cause the gain through the transistor followers 30 and 31 to approximate one half at low operating frequencies and then to peak as the operating frequency increases because of the increasing impedance of the inductors 40 and 42. This peaking effect can be used to significantly broadband the useful frequency range of the amplifier 20. If, instead, the resistance of the resistors 41 and 43 is set substantially greater than the output impedance $1/g_m$ of the transistors 30 and 31, the increasing inductive impedance will have little effect on the gain because it is swamped out by the resistor impedance.

There are, however, headroom degradations when the resistance of the resistors 41 and 43 is set substantially equal to the output impedance $1/g_m$. In this case, it would require a swing of 2 volts at the control terminals of the transistor followers 28 and 29 to effect a swing of 1 volt in the output signal at the output port 21. This will cause the headroom between the transistors 27 and the current sources 55 and 56 to quickly become a problem.

This problem is significantly reduced in the operational amplifier embodiment 77 of FIG. 3. Now the output voltage swing is divided down by the second differential pair 26 instead of being multiplied up by the transistor followers 30 and 31. For the same swing of 1 volt in the output signal at the output port 21, a swing of only 200 millivolts is now required at the output of the transistor followers 28 and 29 if a gain of 10 is assumed for the second differential pair.

In addition to enhancing headroom, the transistor followers now buffer the input capacitance of the second differential pair 26 to thereby broaden the operating frequency of the first differential pair 24. The size of the transistors 27 of the second differential pair 26 is preferably increased so that they can drive the capacitive load $C_L$ directly, i.e., without the intervening buffering of the transistor followers 30 and 31. In an exemplary amplifier embodiment, for example, the size of the transistors 27 could be configured to be between 1 and 2 times the size of the transistor followers 28 and 29.

Figure 4:
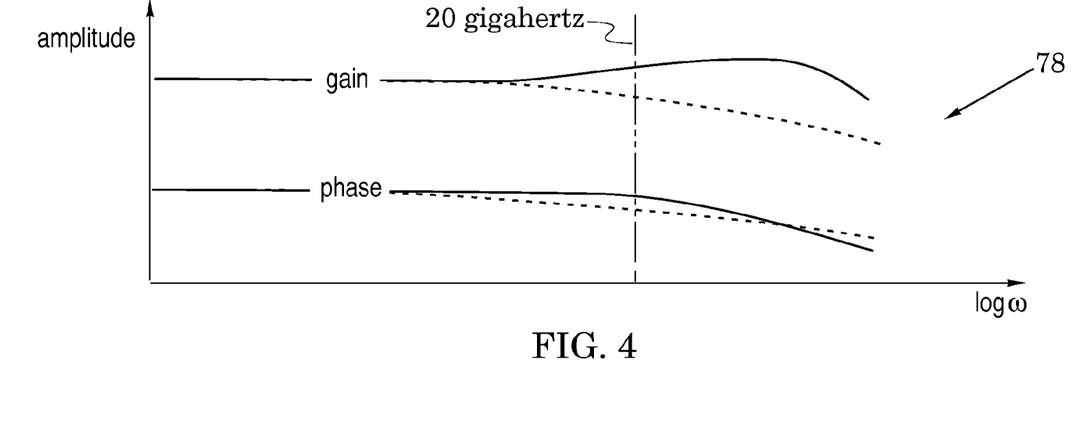
FIG. 4 is a graph that shows operational improvements in the embodiment of FIG. 3.

A graph 78 in FIG. 4 illustrates gain and phase across the intermediate stage of the transistor followers 30 and 31 of the embodiment 77 of FIG. 3 for a first case (shown in broken lines) in which the inductors 40 and 42 have zero inductance and a second case (shown in solid lines) in which they have 20 picohenries of inductance. The graph was generated for a case in which the transistor followers were biased at currents of 25 milliamps and in which the capacitive loads $C_L$ were 700 femtofarads. It is noted that the follower gain has been improved to have a significant peak at higher frequencies (e.g., 20 gigahertz) as each of the inductors 40 and 42 resonate with an associated one of capacitances presented by the gate-to-source capacitance of each of the transistor followers 30 and 31 and the capacitive loads $C_L$. It is further noted that the phase shift has been reduced (e.g., by 12 degrees) which enhances stability when the amplifier embodiment is embedded in a feedback structure. Although not included in the graph 78, it is noted that the capacitance reflected back to the first differential pair 24 is not increased but, rather, is slightly decreased Although the amplifier embodiments of FIGS. 1 and 3 can be effectively used in a variety of amplifier applications, they are especially suited for use in a pipelined analog-to-digital converter systems such as the converter system 80 of FIG. 5. This system comprises a plurality of converter stages 82A, 82B, - - - 82N that are serially connected to thereby convert an analog input signal $S_{in}$ to a corresponding digital output signal $S_{dgtl}$. Each converter stage generates a sample of a respective portion of the analog signal, provides at least one corresponding digital bit, and passes to a subsequent stage a residue signal that represents the difference between that sample and an analog signal that corresponds to the provided digital bit which was an estimate of the sample.

Figure 5:
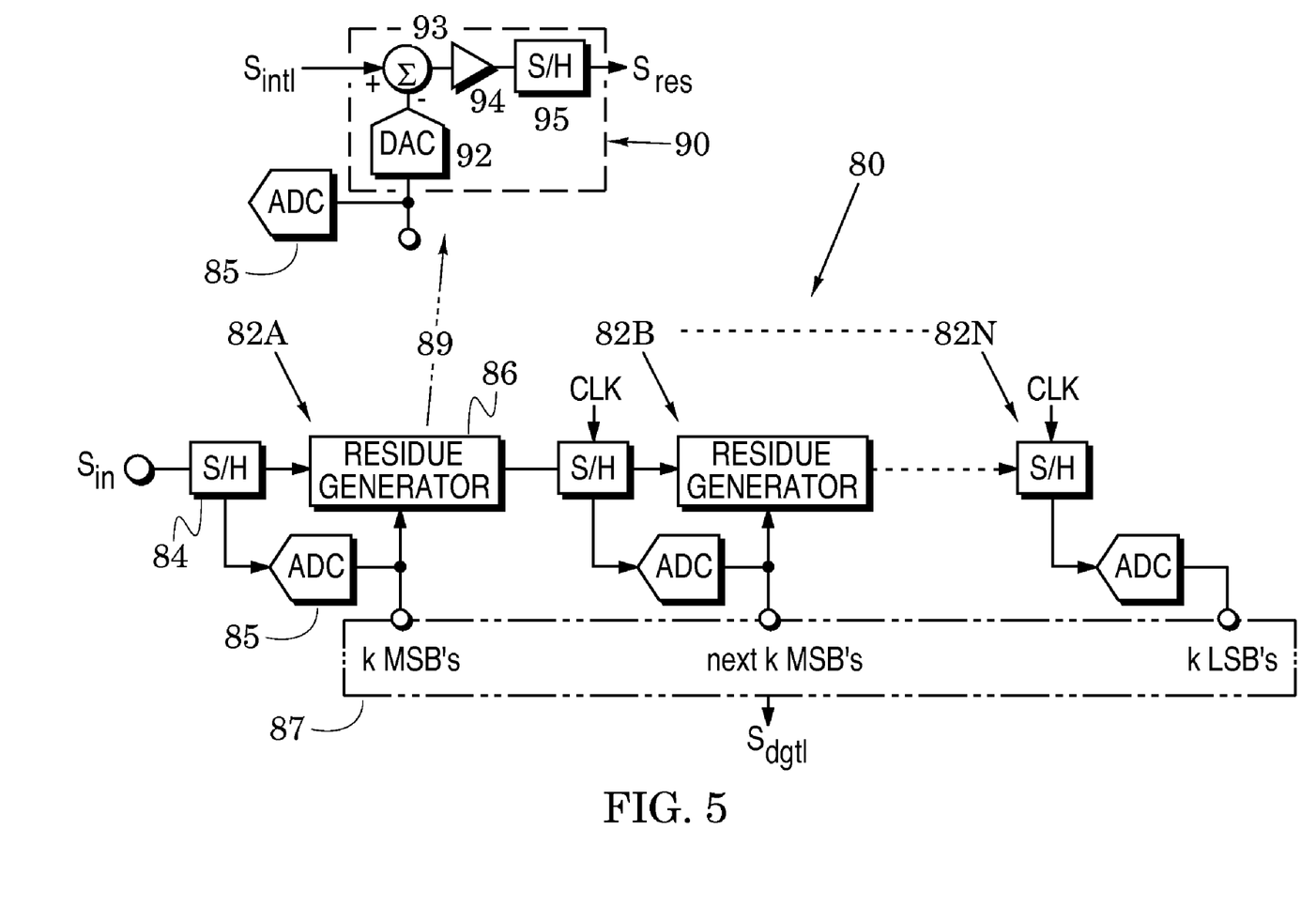
FIG. 5 is a block diagram of a pipelined analog-to-digital converter system in which converter stages include multiplying digital-to-analog converters that are formed with amplifier embodiments such as those of FIGS. 1 and 3.

As shown in FIG. 5, a typical stage 82A includes a sampler 84 (designated S/H for sample and hold), an ADC 85 and a residue generator 86. In operation of the converter stage 82A, the sampler 84 provides initial samples of an analog input signal at the rate of a clock (CLK). The ADC 85 converts each initial sample to k of the most significant bits (MSB's) for this initial sample. The residue generator 146 converts the k MSB's to an analog estimate (estimate of the analog sample) and subtracts this analog estimate from the initial sample to form a residue signal that can be passed to a subsequent converter stage for derivation of further MSB's that apply to the initial sample.

To enhance conversion accuracy, the residue signal is preferably "gained up" in the residue generator so that the analog window presented to the subsequent converter stage is substantially that of the preceding converter stage. Because the final converter stage 82N provides the final least significant bits (LSB's) of the initial sample, it does not require the residue generator of preceding stages. The converter stages are generally designed to provide digital redundancy and an error corrector 87 is typically provided to use this redundancy as it processes the bits of each converter stage into the final digital output signal $S_{dgtl}$ that corresponds to the initial analog sample.

Example arrow 89 illustrates the functional portions of an exemplary residue generator 90 that is often referred to as a multiplying digital-to-analog converter (MDAC). The residue generator 90 includes a DAC 92, a summer 93, an amplifier 94 and another sampler 95. The DAC 92 converts the digital estimate of the ADC 85 to form a corresponding analog estimate. This estimate is subtracted from the initial sample $S_{intl}$ in the summer 93 to find a difference and this difference is amplified in the amplifier 94 to provide the residue signal $S_{res}$. The sampler 95 holds this residue for processing by the succeeding converter stage. The gain of the amplifier is selected so that the amplitude range of samples presented to the succeeding converter stage approximates the range processed by the present converter stage.

Figure 6A:
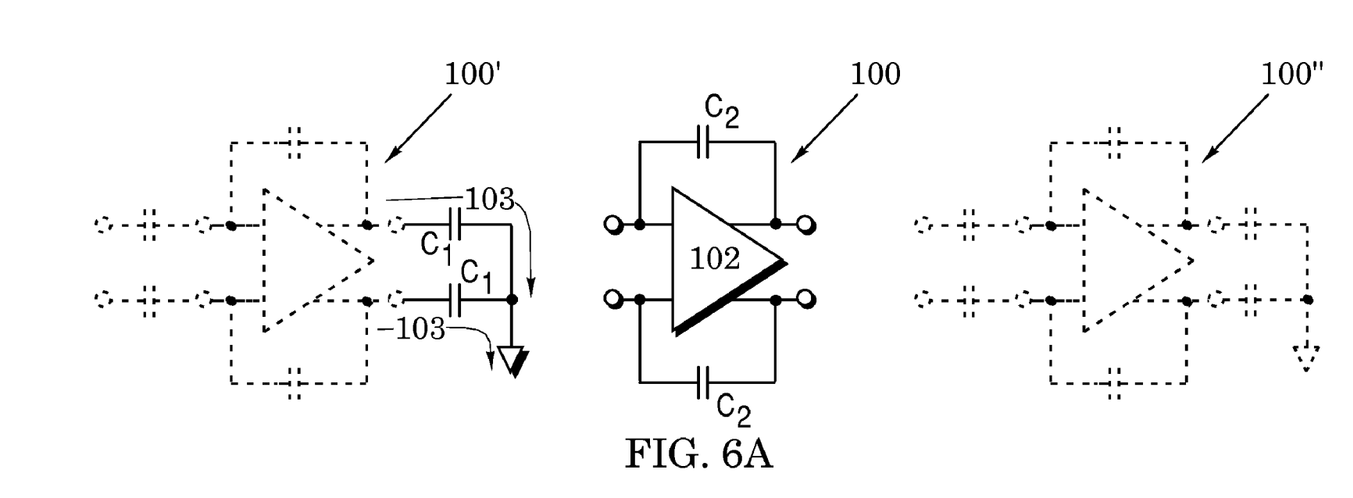
FIGS. 6A and 6B are schematics that illustrate operational modes of the multiplying digital-to-analog converters of FIG. 5.
Figure 6B:
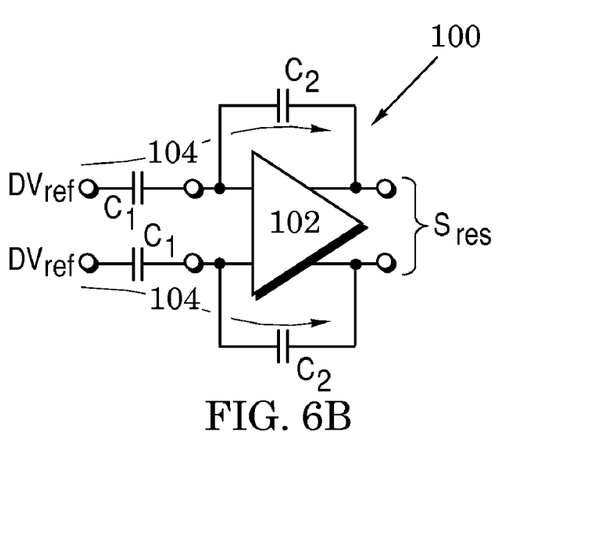

Partly because they lend themselves to integrated circuit fabrication techniques, switched-capacitor realizations of MDAC's have been found particularly useful. FIGS. 4A and 4B illustrate an exemplary switched-capacitor MDAC 100 that is formed with a differential amplifier 102, a set of capacitors $C_1$ and $C_2$, and a set of switches (for illustrative clarity, the switches are not shown).

FIG. 6A illustrates a first operational mode in which capacitors $C_2$ are coupled between differential inputs and differential outputs of the amplifier 102 while capacitors $C_1$ are switched to receive charges (as indicated by charge-reception currents 103) from the differential outputs of an MDAC 100' in a preceding converter stage. The amplifier 102 is structured (e.g., with internal clamps) to remove all charges from the capacitors $C_2$ during this first operational mode. An MDAC 100'' of a succeeding converter stage is shown in a configuration similar to that of the MDAC 100'.

FIG. 6B illustrates a second operational mode in which capacitors $C_2$ remain coupled between differential inputs and differential outputs of the amplifier 100 while the capacitors $C_1$ are switched to the amplifier's differential inputs. The associated ADC (85 in FIG. 5) converts the residue signal of the preceding converter stage to its corresponding digital bits and provides an indicator D that is indicative of those bits. A reference signal $DV_{ref}$ is then coupled to the other ends of the capacitors $C_1$ wherein the reference $V_{ref}$ generally represents one half of the full-scale range of the associated ADC.

As indicated by charge-transfer currents 104 in FIG. 6B, the reference signal $DV_{ref}$ causes the charges in the capacitors $C_1$ to be transferred into the capacitors $C_2$ to thereby generate the residue signal $S_{res}$. In other switched-capacitor embodiments, the capacitors $C_2$ are also switched to receive charge-reception currents 103 from the MDAC 100' in the first operational mode of FIG. 6A. In the second operational mode, they are then switched to the positions shown in FIG. 6B. The capacitors $C_1$ and $C_2$ are appropriately sized depending upon the specific switched-capacitor structure that is employed.

The conversion fidelity of the converter system 80 of FIG. 5 is a function of the accuracy of the charge-reception currents 103 and charge-transfer currents 104 that occur in the first and second operational modes. High amplifier input gain causes the differential input of the amplifier 102 to be a virtual ground so that all of the currents 104 flow out of the capacitors $C_1$ and high amplifier input impedance steers all of the currents 104 into the capacitors $C_2$. The accuracy of the capacitive currents is further enhanced by high amplifier bandwidth and headroom whereas stability is enhanced by sufficient amplifier phase margin. The structure of the amplifier 20 of FIG. 1 provides these necessary amplifier parameters.

It was noted above that the amplifier 102 is preferably structured to remove all charges from the capacitors $C_2$ during the first operational mode of FIG. 2A. FIG. 1 indicates that internal clamps 110 (indicated as CLMP) for this purpose may be coupled across outputs of the differential pairs 24 and 26 and across the current sources 34 and 35.

Amplifier embodiments have been disclosed to facilitate selective positioning of first and second transfer function poles to thereby enhance bandwidth, facilitate selective positioning of complex third transfer function poles to enhance phase margin, and facilitate greater voltage swing by enhancing headroom.

The embodiments of the disclosure described herein are exemplary and numerous modifications, variations and rearrangements can be readily envisioned to achieve substantially equivalent results, all of which are intended to be embraced within the spirit and scope of the invention as defined in the appended claims.

We claim:

1. An amplifier, comprising:
   a first differential pair of input transistors;
   a second differential pair of transistors;
   first and second compensation capacitors each coupled between a respective transistor of said second differential pair and a respective transistor of said first differential pair;
   first and second resistors;
   first and second inductors; and
   first and second transistor followers each arranged to drive a respective one of said first and second resistors and to drive a respective one of said first and second inductors;
   wherein, in a first selected arrangement to enhance bandwidth and phase margin, said second differential pair is coupled between said first differential pair and said first and second transistor followers and, in a second selected arrangement to enhance headroom, said first and second transistor followers are coupled between said first and second differential pairs.

2. The amplifier of claim 1, further including third and fourth transistor followers each inserted to drive a respective one of said compensation capacitors in response to a respective transistor of said second differential pair.

3. The amplifier of claim 1, further including resistors that are each arranged in series with a respective one of said compensation capacitors.

4. The amplifier of claim 1, wherein said resistors are realized with transistors biased in their ohmic regions.

5. The amplifier of claim 1, wherein said first and second transistor followers are first and second source followers.

6. The amplifier of claim 1, wherein said first and second transistor followers are first and second emitter followers.

7. The amplifier of claim 1, wherein said first differential pair includes cascode transistors that are each inserted after a respective one of said input transistors.

8. A signal converter system, comprising:
   a plurality of converter stages serially connected to thereby convert an analog input signal to a corresponding digital output signal wherein at least one of said stages includes:
   an analog-to-digital converter that converts a respective portion of said input signal to at least one corresponding digital bit of said output signal;
   a digital-to-analog converter that provides reference signals in response to said corresponding digital bit;
   a differential amplifier; and
   a set of capacitors switched to a preceding one of said stages in a first converter operational mode and switched between said amplifier and said reference signals in a second converter operational mode;
   wherein said amplifier includes:
   a first differential pair of input transistors arranged to respond to said input signal;
   a second differential pair of transistors;
   first and second compensation capacitors each coupled between a respective transistor of said second differential pair and a respective transistor of said first differential pair;
   first and second resistors;
   first and second inductors; and
   first and second transistor followers each arranged to drive a respective one of said first and second resistors and to drive a respective one of said first and second inductors;
   wherein, in a first selected arrangement to enhance bandwidth and phase margin, said second differential pair is coupled between said first differential pair and said first and second transistor followers and, in a second selected arrangement to enhance headroom, said first and second transistor followers are coupled between said first and second differential pairs.

9. The system of claim 1, further including third and fourth transistor followers each inserted to drive a respective one of said compensation capacitors in response to a respective transistor of said second differential pair.

10. The system of claim 1, further including resistors that are each arranged in series with a respective one of said compensation capacitors.

11. The system of claim 1, wherein said resistors are realized with transistors biased in their ohmic regions.

12. The system of claim 1, wherein said first and second transistor followers are first and second source followers.

13. The system of claim 1, wherein said first and second transistor followers are first and second emitter followers.

14. The system of claim 1, wherein said first differential pair includes cascode transistors that are each inserted after a respective one of said input transistors.

\* \* \* \* \*